(12) United States Patent
Li et al.

(10) Patent No.: US 11,573,264 B2
(45) Date of Patent: Feb. 7, 2023

(54) DEVICE FOR TESTING CHIP OR DIE WITH BETTER SYSTEM IR DROP

(71) Applicant: MEDIATEK INC., Hsin-Chu (TW)

(72) Inventors: Ching-Chih Li, Hsinchu (TW); Sheng-Ming Chang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 190 days.

(21) Appl. No.: 16/828,925

(22) Filed: Mar. 24, 2020

(65) Prior Publication Data

US 2020/0326368 A1 Oct. 15, 2020

Related U.S. Application Data

(60) Provisional application No. 62/831,797, filed on Apr. 10, 2019.

(51) Int. Cl.
*G01R 31/28* (2006.01)
(52) U.S. Cl.
CPC .............................. *G01R 31/2884* (2013.01)
(58) Field of Classification Search
CPC ............ G01R 31/2884; G01R 1/07378; G01R 31/2863; G01R 31/2889; G01R 1/07371; G01R 31/28; G01R 1/0408; G01R 31/2832; H01L 23/49827; H01L 24/16; H01L 2224/16235; H01L 2924/15311; H01L 2924/15313; H01L 2924/19041; H01L 2924/19042; H01L 2924/19043; H01L 2924/19105; H01L 23/642
See application file for complete search history.

(56) References Cited

U.S. PATENT DOCUMENTS 6,218,910 B1  4/2001  Miller
2004/0239349 A1  12/2004  Yamagishi
(Continued)

FOREIGN PATENT DOCUMENTS

JP   2019-90632 A   6/2019
TW   I470234 B      1/2015
(Continued)

OTHER PUBLICATIONS

Y. Nabeshima, Y. Oizono, T. Okumura and T. Sudo, "On-chip power integrity evaluation system," 2011 8th Workshop on Electromagnetic Compatibility of Integrated Circuits, 2011, pp. 165-169 (Year: 2011).*
(Continued)

*Primary Examiner* — Daniel R Miller
(74) *Attorney, Agent, or Firm* — Winston Hsu

(57) ABSTRACT

The present invention provides a device for testing a chip, wherein the device includes a testing board and an interposer. The testing board has a plurality of pads for providing a plurality of test signals. The interposer board includes a plurality of passive components, and at least one of the passive components is coupled between a supply voltage and a ground voltage, and the supply voltage and the ground voltage are received from a power pad and a ground pad of the plurality of pads of the testing board, respectively; wherein the chip is positioned in the device, the chip receives the test signals including the supply voltage and the ground voltage from the power pad and the ground pad of the testing board, respectively.

11 Claims, 3 Drawing Sheets

(56) References Cited

U.S. PATENT DOCUMENTS

| | | | | |
|---|---|---|---|---|
| 2005/0280146 A1* | 12/2005 | Cornelius | | H01L 24/13 |
| | | | | 257/730 |
| 2006/0152234 A1* | 7/2006 | Miller | | G01R 31/2889 |
| | | | | 324/750.3 |
| 2007/0018672 A1 | 1/2007 | Jacobsen | | |
| 2008/0285244 A1 | 11/2008 | Knickerbocker | | |
| 2009/0322364 A1* | 12/2009 | Mangrum | | G01R 31/2889 |
| | | | | 324/757.02 |
| 2010/0276188 A1* | 11/2010 | Russell | | H05K 1/185 |
| | | | | 174/260 |
| 2012/0067636 A1* | 3/2012 | Kim | | H01L 23/49827 |
| | | | | 174/260 |
| 2015/0309074 A1 | 10/2015 | Kuo | | |
| 2017/0250146 A1* | 8/2017 | Warwick | | G01R 1/07342 |
| 2018/0180668 A1* | 6/2018 | Ong | | G01R 31/2889 |

FOREIGN PATENT DOCUMENTS

| | | | | |
|---|---|---|---|---|
| TW | | I537565 B | 6/2016 | |
| WO | WO-2019093527 A1 * | | 5/2019 | H01R 33/76 |

OTHER PUBLICATIONS

D. Tanaka et al., Interposer Design and Measurement with Various Caparcitors for Reducing Total System PDN Impedance, ICEP-IAAC 2015 Proceedings, FD4-4, pp. 767-770, 2015, XP032780032.
Katsuya Kikuchi et al., Ultralow Impedance Evaluation System of Wideband Frequency for Power Distribution Network of Decoupling Capacitor Embedded Substrates, 2009 IEEE, USA, pp. 1-4, 2009, XP031557953.

* cited by examiner

DEVICE FOR TESTING CHIP OR DIE WITH BETTER SYSTEM IR DROP

CROSS REFERENCE TO RELATED APPLICATIONS

This application claims the priority of U.S. Provisional Application No. 62/831,797, filed on Apr. 10, 2019, which is included herein by reference in its entirety.

BACKGROUND

When a chip is positioned in a socket and to be tested, the testing board provides a plurality of test signal to the chip for testing the functions. During the test of the chip, the chip may perform different operations having different power consumption, and the chip may draw different currents from the testing board, causing an IR drop and the stabilization of the supply voltage is worsened.

In order to stabilize the supply voltage inputted into the chip, decoupling/bypassing capacitors are provided on the testing board to mitigate the IR drop issue. However, the effect of this design is not good enough because the distance between the decoupling/bypassing capacitors and the chip is too far.

SUMMARY

It is therefore an objective of the present invention to provide a device for testing the chip, which uses an interposer board having the decoupling/bypassing capacitors to stabilize the supply voltage of the chip, to solve the above-mentioned problems. In addition, the interposer board may have other passive components to improve the test performance.

According to one embodiment of the present invention, a device for testing a chip is disclosed, wherein the device comprises a testing board and an interposer. The testing board has a plurality of pads for providing a plurality of test signals. The interposer board comprises a plurality of passive components, and at least one of the passive components is coupled between a supply voltage and a ground voltage, and the supply voltage and the ground voltage are received from a power pad and a ground pad of the plurality of pads of the testing board, respectively; wherein the chip is positioned in the device, the chip receives the test signals comprising the supply voltage and the ground voltage from the power pad and the ground pad of the testing board, respectively.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
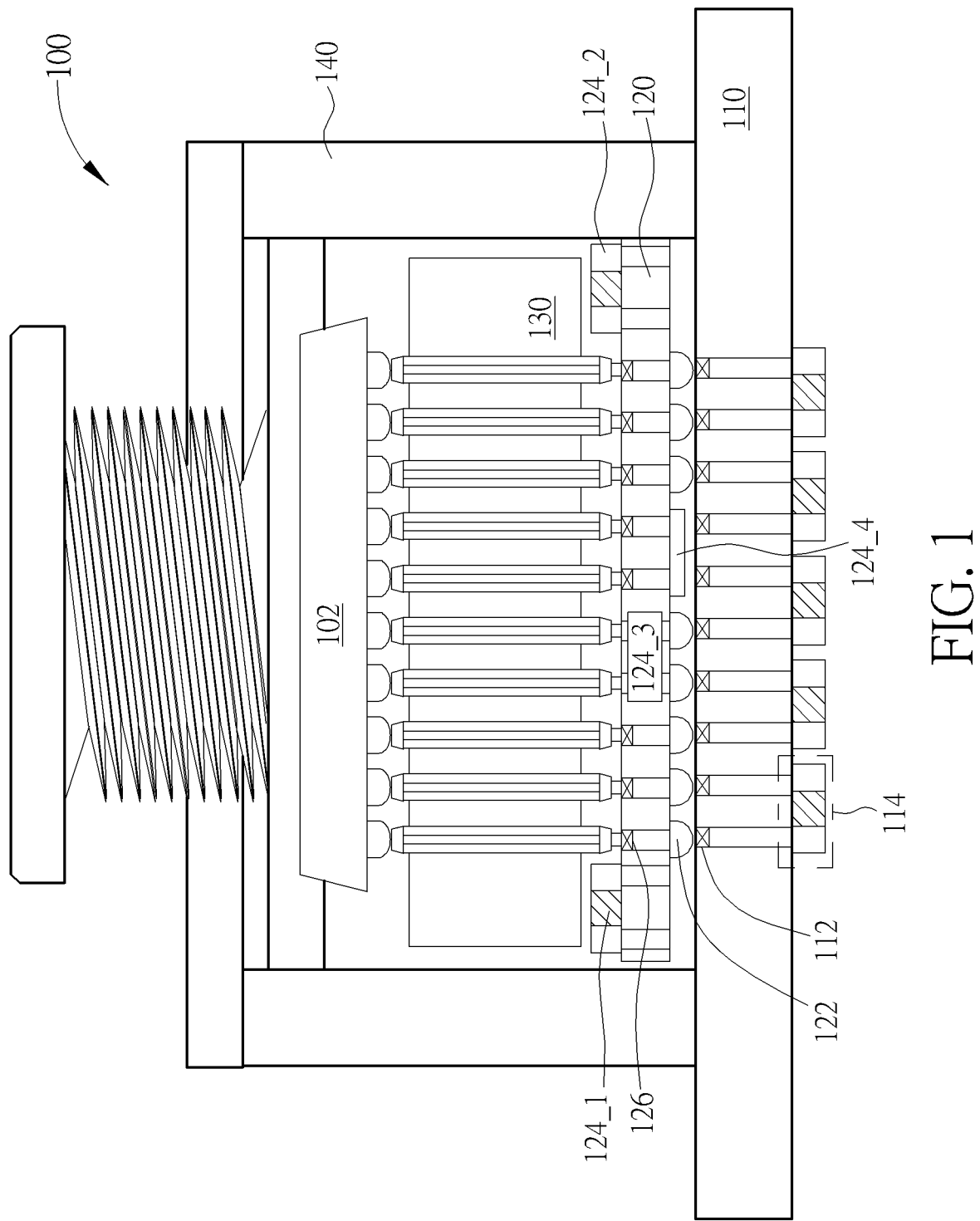
FIG. 1 is a diagram illustrating a device for testing a chip according to one embodiment of the present invention.

FIG. 1 is a diagram illustrating a device 100 for testing a chip 102 according to one embodiment of the present invention. As shown in FIG. 1, the device 100 comprises a testing board (printed circuit board, PCB) 110, an interposer board (PCB) 120, a connector 130 and a socket housing 140. In this embodiment, the device 100 is used to test the chip 102 when the chip 102 is positioned within the socket housing 140. The testing board 110 has a plurality of pads 112 and a plurality of capacitors 114, wherein the pads 112 are on an upper surface of the testing board, for providing a plurality of test signals, and the pads 112 comprise a power pad for providing a supply voltage such as 1 V, 1.8V or 3.3V, and a ground pad for providing a ground voltage; and the capacitors 114 are coupled between the supply voltage and the ground voltage, that is one electrode of each capacitor 114 connects to the supply voltage via a power line within the testing board 110, and the other electrode of each capacitor 114 connects to the ground voltage via a ground line within the testing board 110. The interposer board 120 comprises a plurality of first pads 122 and a plurality of second pads 126, the first pads 122 mounted on the lower surface of the interposer board 120 are connected to the pads 112 of the testing board 110, and the first pads 122 are used to receive the test signals from the testing board 110; and the second pads 126 are connected to the first pads 122 via the internal routing of the interposer board 120, and the second pads 126 receive the test signals from the first pads 122, respectively. In addition, the interposer board 120 further comprises a plurality of capacitors 124_1, 124_2, 124_3 and 124_4, wherein the capacitors 124_1 and 124_2 are mounted on an upper surface, the capacitor(s) 124_3 is within the interposer board 120, the capacitor(s) 124_4 is mounted on the lower surface of the interposer board 120, and capacitors 124_1, 124_2, 124_3 and 124_4 are coupled between the supply voltage and the ground voltage, that is one electrode of each of the capacitors 124_1, 124_2, 124_3 and 124_4 connects to the supply voltage via a power line within the interposer board 120, and the other electrode of each of the capacitors 124_1, 124_2, 124_3 and 124_4 connects to the ground voltage via a ground line within the interposer board 120. The connector 130 has a plurality of spring probes inside, and the connector 130 is used to receive the test signals from the second pads 126 of the interposer board 120, and transmit the received test signals to the chip 102.

In this embodiment, the capacitor 114 of the testing board 110 and the capacitors 124_1-124_4 of the interposer board 120 are connected to the same power supply and the same ground voltage. In another embodiment, if the chip 102 has two or more power domains, the capacitors 114 and 124_1-124_4 may be divided into different portions, where one portion of the capacitors connected to a first power supply and a first ground voltage, and another portion of the capacitors connected to a second power supply and a second ground voltage.

When the chip 102 is positioned in the socket housing 140, the chip 102 can receive the test signals from the testing board 110 via the interposer board 120 and the connector 130. When the chip 102 switches the operations and the current drawn by the chip 102 changes, the capacitors 114 of the testing board 110 and the capacitors 124_1-124_4 of the interposer board 120 serving as decoupling/bypassing capacitors can effectively stabilize the supply voltage, that is the voltage drop issue can be eliminated. Furthermore, because the interposer board 120 is closer to the chip 102, the capacitors 124_1-124_4 of the interposer board 120 have better effect than the capacitors 114 on the testing board 110.

In practice, the interposer board 120 may have more capacitors coupled between the supply voltage and the ground voltage, and the capacitors may have different designs and capacitance in consideration of space within the interposer board 120.

It is noted that, in consideration of different applications of the device 100 or the chip 102, at least a portion of the capacitors 124_1-124_4 can be replaced by other two-pin passive component(s) such as an inductor or a resistor, or other more than two-pin passive components (N-pin passive component, N is a positive integer greater than two) such as a multiplexer, a relay circuit, a switch, a network resistor or a network capacitor. Taking the multiplexer or the switch as an example, the device 100 may need to transmit different test signals to the same channel of the chip 102, so the conventional device may design some multiplexers or switches on the PCB 110 to select the appropriate test signals inputted to the chip 102. In one embodiment, some multiplexers or switches may be positioned in the interposer board 120, and positions of multiplexers or switches may be the same as that of one of the capacitors 124_1-124_4. The multiplexers or switches within the interposer board 120 may select a first test signal from the PCB 110 and output the first test signal to the chip 102 for a first test period, and may select a second test signal from the PCB 110 and output the second test signal to the chip 102 for a second test period. By using the passive component(s) such as the multiplexers or switches in the interposer board 120, the PCB design can be simplified to save the manufacturing cost.

In one embodiment, one or more capacitors 124_1-124_4 can be removed from the interposer board 120. For example, the interposer board 120 may comprise only the capacitors 124_1 and 124_2 mounted on the upper surface, or the interposer board 120 may comprise only the embedded capacitor 124_3, or the interposer board 120 may comprise only the capacitor 124_4 mounted on the lower surface, or the interposer board 120 may comprise only two of the capacitors 124_1, 124_3 and 124_4. These alternative designs shall fall within the scope of the present invention.

Figure 2:
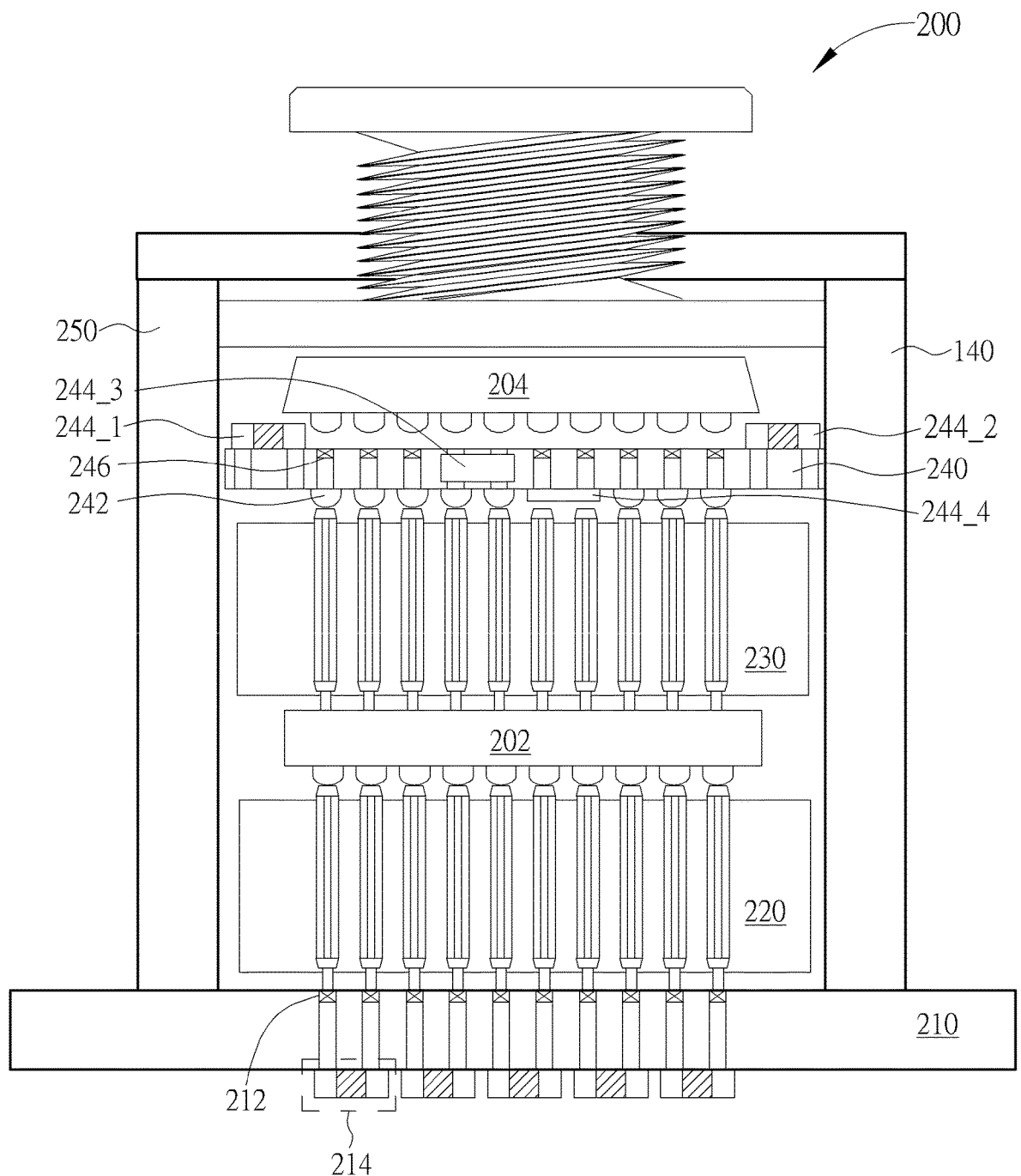
FIG. 2 is a diagram illustrating a device for testing a chip according to one embodiment of the present invention.

FIG. 2 is a diagram illustrating a device 200 for testing a chip 202 according to one embodiment of the present invention. As shown in FIG. 2, the device 200 comprises a testing board (PCB) 210, two connectors 220 and 230, an interposer board (PCB) 240 and a socket housing 250. In this embodiment, the device 200 is used to test the chip 202 when the chip 202 is positioned within the socket housing 250. The testing board 210 has a plurality of pads 212 and a plurality of capacitors 214, wherein the pads 212 are on an upper surface of the testing board, for providing a plurality of test signals, and the pads 112 comprise a power pad for providing a supply voltage such as 1V, 1.8V or 3.3V, and a ground pad for providing a ground voltage; and the capacitors 214 are coupled between the supply voltage and the ground voltage, that is one electrode of each capacitor 214 connects to the supply voltage via a power line within the testing board 210, and the other electrode of each capacitor 214 connects to the ground voltage via a ground line within the testing board 210. The connector 220 has a plurality of spring probes inside, and the connector 220 is used to receive the test signals from the pads 212 of the testing board 210, and transmit the received test signals to the chip 202. The connector 230 has a plurality of spring probes inside, and the connector 230 is used to receive at least a portion of the test signals comprising the supply voltage and the ground voltage from the chip 202, and transmit the received test signals to the interposer board 240. The interposer board 240 comprises a plurality of first pads 222 and a plurality of second pads 226, the first pads 222 mounted on the lower surface of the interposer board 240 are connected to the connector 230, and the first pads 222 are used to receive the test signals from the connector 230; and the second pads 226 are connected to the first pads 222 via the internal routing of the interposer board 240, and the second pads 226 receive the test signals from the first pads 222, respectively. In addition, the interposer board 240 further comprises a plurality of capacitors 244_1-244_4, wherein the capacitors 244_1 and 244_2 are mounted on an upper surface, the capacitor(s) 244_3 is within the interposer board 240, the capacitor(s) 244_4 is mounted on the lower surface of the interposer board 240, and capacitors 244_1-244_4 are coupled between the supply voltage and the ground voltage, that is one electrode of each of the capacitors 244_1-244_4 connects to the supply voltage via a power line within the interposer board 240, and the other electrode of each of the capacitors 244_1-244_4 connects to the ground voltage via a ground line within the interposer board 240. The chip 204 can receive the test signals from the second pads 246 of the interposer board 240.

In this embodiment, the capacitor 214 of the testing board 210 and the capacitors 244_1-244_4 of the interposer board 240 are connected to the same power supply and the same ground voltage. In another embodiment, if the chip 202 has two or more power domains, the capacitors 214 and 244_1-244_4 may be divided into different portions, where one portion of the capacitors connected to a first power supply and a first ground voltage, and another portion of the capacitors connected to a second power supply and a second ground voltage.

When the chips 202 and 204 are positioned in the socket housing 250, the chip 202 can receive the test signals from the testing board 210 via the connector 220, and the chip 204 can receive the test signals from the testing board 220 via the connector 220, the chip 202 and the connector 230. When the chip 202 switches the operations and the current drawn by the chip 202 changes, the capacitors 214 of the testing board 210 and the capacitors 244_1-244_4 of the interposer board 240 serving as decoupling/bypassing capacitors can effectively stabilize the supply voltage, that is the voltage drop issue can be eliminated. Furthermore, because the capacitors 244_1-244_4 of the interposer board 240 are closer to the chip 202, the capacitors 244_1-244_4 of the interposer board 240 can provided better effect than the capacitors 214 on the testing board 210.

In practice, the interposer board 240 may have more capacitors coupled between the supply voltage and the ground voltage, and the capacitors may have different designs and capacitance in consideration of space within the interposer board 240.

It is noted that, in consideration of different applications of the device 200 or the chip 202/204, at least a portion of the capacitors 244_1-244_4 can be replaced by other two-pin passive component(s) such as an inductor or a resistor, or other more than two-pin passive components (N-pin passive component, N is a positive integer greater than two) such as a multiplexer, a relay circuit, a switch, a network resistor or a network capacitor.

In one embodiment, one or more capacitors 244_1-244_4 can be removed from the interposer board 240. For example, the interposer board 240 may comprise only the capacitors 244_1 and 244_2 mounted on the upper surface, or the interposer board 240 may comprise only the embedded capacitor 244_3, or the interposer board 240 may comprise only the capacitor 244_4 mounted on the lower surface, or the interposer board 240 may comprise only two of the capacitors 244_1, 244_3 and 244_4. These alternative designs shall fall within the scope of the present invention.

Figure 3:
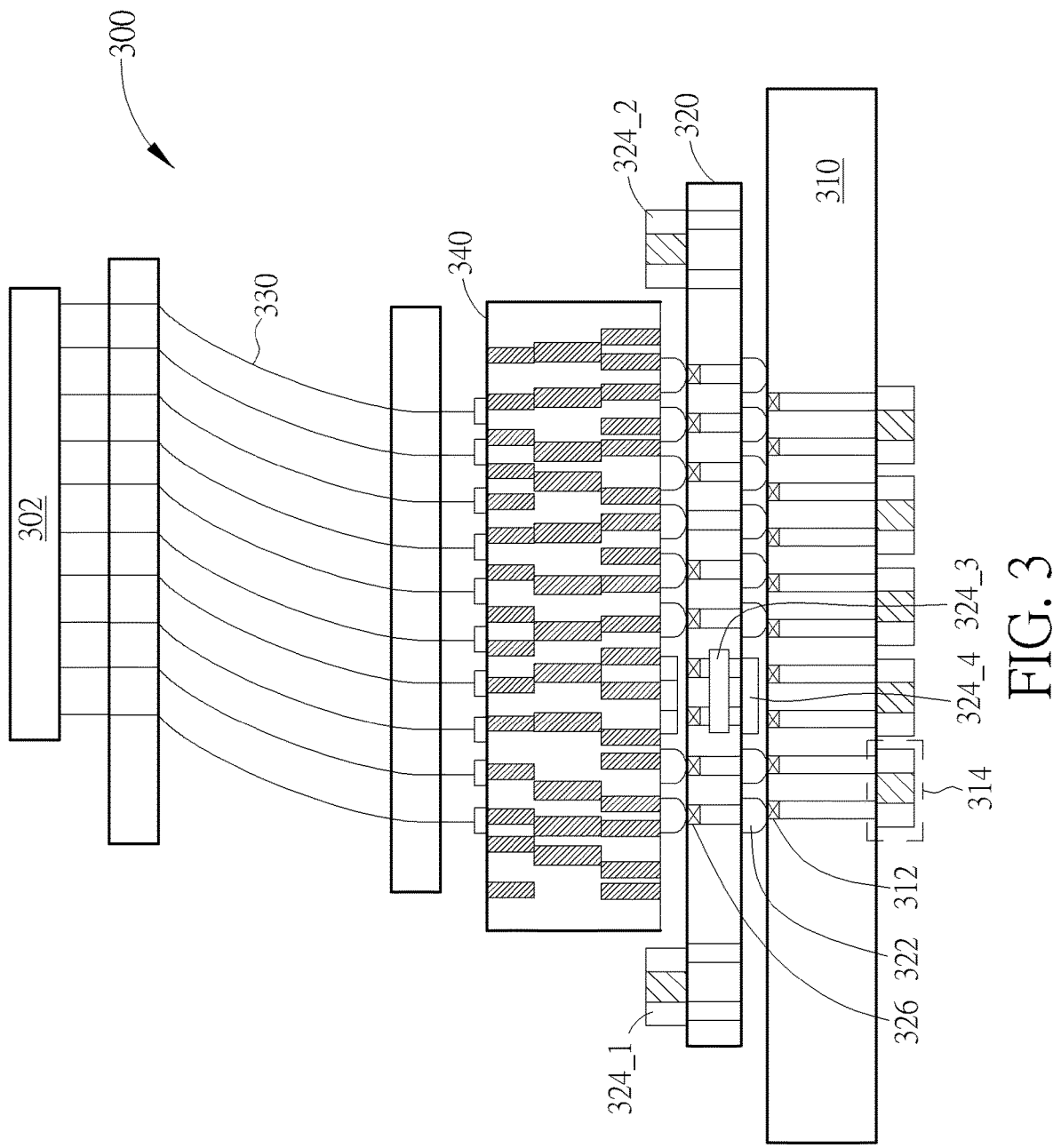
FIG. 3 is a diagram illustrating a device for testing a die according to one embodiment of the present invention.

FIG. 3 is a diagram illustrating a device 300 for testing a die 302 according to one embodiment of the present invention. As shown in FIG. 3, the device 300 comprises a testing board (PCB) 310, an interposer board (PCB) 320, a substrate 340 and a plurality of probes 330. In this embodiment, the device 300 is used to test a die 302. The testing board 310 has a plurality of pads 312 and a plurality of capacitors 314, wherein the pads 312 are on an upper surface of the testing board, for providing test signals, and the pads 312 comprise a power pad for providing a supply voltage such as 1 V, 1.8V or 3.3V, and a ground pad for providing a ground voltage; and the capacitors 314 are coupled between the supply voltage and the ground voltage, that is one electrode of each capacitor 314 connects to the supply voltage via a power line within the testing board 310, and the other electrode of each capacitor 314 connects to the ground voltage via a ground line within the testing board 310. The interposer board 320 comprises a plurality of first pads 322 and a plurality of second pads 326, the first pads 322 mounted on the lower surface of the interposer board 320 are connected to the pads 312 of the testing board 310, and the first pads 322 are used to receive the test signals from the testing board 310; and the second pads 326 are connected to the first pads 322 via the internal routing of the interposer board 320, and the second pads 326 receive the test signals from the first pads 322, respectively. In addition, the interposer board 320 further comprises a plurality of capacitors 324_1, 324_2, 324_3 and 324_4, wherein the capacitors 324_1 and 324_2 are mounted on an upper surface, the capacitor(s) 324_3 is within the interposer board 320, the capacitor(s) 324_4 is mounted on the lower surface of the interposer board 320, and capacitors 324_1, 324_2, 324_3 and 324_4 are coupled between the supply voltage and the ground voltage, that is one electrode of each of the capacitors 324_1, 324_2, 324_3 and 324_4 connects to the supply voltage via a power line within the interposer board 320, and the other electrode of each of the capacitors 324_1, 324_2, 324_3 and 324_4 connects to the ground voltage via a ground line within the interposer board 320. The substrate 340 receives the test signals from the second pads 326, and outputs the test signals to the die 302 via the probes 330.

In this embodiment, the capacitor 314 of the testing board 310 and the capacitors 324_1-324_4 of the interposer board 320 are connected to the same power supply and the same ground voltage. In another embodiment, if the die 302 has two or more power domains, the capacitors 314 and 324_1-324_4 may be divided into different portions, where one portion of the capacitors connected to a first power supply and a first ground voltage, and another portion of the capacitors connected to a second power supply and a second ground voltage.

When the die 302 is tested, the die 302 can receive the test signals from the testing board 310 via the interposer board 320, the substrate 340 and the probes 330. When the die 302 switches the operations and the current drawn by the die 302 changes, the capacitors 314 of the testing board 310 and the capacitors 324_1-324_4 of the interposer board 320 serving as decoupling/bypassing capacitors can effectively stabilize the supply voltage, that is the voltage drop issue can be eliminated.

In practice, the interposer board 320 may have more capacitors coupled between the supply voltage and the ground voltage, and the capacitors may have different designs and capacitance in consideration of space within the interposer board 320.

It is noted that, in consideration of different applications of the device 300 or the die 302, at least a portion of the capacitors 124_1-124_4 can be replaced by other two-pin passive component(s) such as an inductor or a resistor, or other more than two-pin passive components (N-pin passive component, N is a positive integer greater than two) such as a multiplexer, a relay circuit, a switch, a network resistor or a network capacitor.

In one embodiment, one or more capacitors 324_1-324_4 can be removed from the interposer board 320. For example, the interposer board 320 may comprise only the capacitors 324_1 and 324_2 mounted on the upper surface, or the interposer board 320 may comprise only the embedded capacitor 324_3, or the interposer board 320 may comprise only the capacitor 324_4 mounted on the lower surface, or the interposer board 320 may comprise only two of the capacitors 324_1, 324_3 and 324_4. These alternative designs shall fall within the scope of the present invention.

Briefly summarized, in the device for testing the chip or the die, by additionally providing the interposer board having the passive components such as decoupling/bypassing capacitors closer to the chip or the die to be tested, the system IR drop issue or other performance issue can be improved, and the power supply can be stabilized more effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A device for testing a chip or a die, comprising:
a testing board having a plurality of pads, for providing a plurality of test signals;
an interposer board, wherein the interposer board comprises a plurality of passive components, and one electrode of at least one of the passive components is connected to a supply voltage, another electrode of the at least one of the passive components is connected to a ground voltage, and the supply voltage and the ground voltage are received from a power pad and a ground pad of the plurality of pads of the testing board, respectively;
a first connector; and
a second connector;
wherein the chip or the die is positioned in the device, the chip or the die receives the test signals comprising the supply voltage and the ground voltage from the power pad and the ground pad of the testing board, respectively;
wherein the first connector is positioned under the chip, the second connector is positioned above the chip and the second connector is between the interposer board and the chip, and the interposer board receives the supply voltage and the ground voltage from the power pad and the ground pad of the testing board via the first connector and the second connector.

2. The device of claim 1, wherein the interposer board has a first surface comprising a plurality of first pads and a second surface comprising a plurality of second pads, wherein the first pads are used to connect to the pads of the second connector to receive the supply voltage and the ground voltage from the testing board, and the second pads are used to connect to another chip.

3. The device of claim 2, wherein the at least one of the passive components is mounted on the first surface of the interposer board.

4. The device of claim 2, wherein the at least one of the passive components is mounted on the second surface of the interposer board.

5. The device of claim 2, wherein the at least one of the passive components is within the interposer board.

6. The device of claim 1, wherein the plurality of passive components comprise a two-pin passive component.

7. The device of claim 6, wherein the plurality of passive components comprise at least one capacitor.

8. The device of claim 6, wherein the plurality of passive components comprise at least one inductor.

9. The device of claim 6, wherein the plurality of passive components comprise at least one resistor.

10. The device of claim 1, wherein the plurality of passive components comprise a more than two-pin passive component.

11. The device of claim 10, wherein the plurality of passive components comprise a multiplexer, a relay circuit, a switch, a network resistor or a network capacitor.

* * * * *